United States Patent
Krech, Jr. et al.

(10) Patent No.: US 6,968,545 B1
(45) Date of Patent: Nov. 22, 2005

(54) METHOD AND APPARATUS FOR NO-LATENCY CONDITIONAL BRANCHING

(75) Inventors: Alan S Krech, Jr., Fort Collins, CO (US); Stephen D Jordan, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 798 days.

(21) Appl. No.: 09/659,256

(22) Filed: Sep. 11, 2000

(51) Int. Cl.[7] ............................................. G06F 9/45
(52) U.S. Cl. .................. 717/153; 717/140; 717/151; 712/234; 712/236
(58) Field of Search ................ 717/140–143, 717/151; 712/216–239

(56) References Cited

U.S. PATENT DOCUMENTS

| | | | | |
|---|---|---|---|---|
| 4,742,466 A | * | 5/1988 | Ochiai et al. | 714/45 |
| 5,274,770 A | * | 12/1993 | Khim Yeoh et al. | 712/38 |
| 5,276,776 A | * | 1/1994 | Grady et al. | 706/48 |
| 5,408,620 A | * | 4/1995 | Asakawa et al. | 712/234 |
| 5,479,649 A | * | 12/1995 | Runaldue et al. | 714/724 |
| 5,534,799 A | * | 7/1996 | Akiyama | 327/20 |
| 5,632,023 A | * | 5/1997 | White et al. | 712/218 |
| 5,740,393 A | * | 4/1998 | Vidwans et al. | 712/215 |
| 5,991,868 A | * | 11/1999 | Kamiyama et al. | 712/32 |
| 6,067,617 A | * | 5/2000 | Webb et al. | 712/245 |
| 6,182,211 B1 | * | 1/2001 | Yamasaki | 712/239 |
| 6,272,599 B1 | * | 8/2001 | Prasanna | 711/138 |
| 6,380,730 B1 | * | 4/2002 | Arkin et al. | 324/158.1 |
| 6,546,550 B1 | * | 4/2003 | Ogata et al. | 717/148 |

* cited by examiner

*Primary Examiner*—Kakali Chaki
*Assistant Examiner*—Lawrence Shrader
(74) *Attorney, Agent, or Firm*—June L. Bouscaren

(57) ABSTRACT

An apparatus to perform no-latency conditional branching has a sequencer for executing program instructions including one or more conditional branch instructions. The conditional branch instruction is a binary word specifying a branch condition address and a conditional instruction. The branch unit has a programmable flag selection memory and a plurality of first flag selectors and determines in hardware whether to branch according to the conditional instruction. Each first flag selector accepts a plurality of available flags and selects a flag based upon contents in the flag selection memory. A second flag selector accepts the flags from the first flag selectors and selects one of the flags to present as a branch flag based upon the branch condition address. The branch flag indicates whether to branch to the destination address.

18 Claims, 8 Drawing Sheets

$$600\begin{cases} x=0,\ y=0,\ dl=0,\ dh=0; \\ xmin=0,\ ymin=0; \\ xmax=50,\ ymax=100; \\ amax=3,\ bmax=3,\ cmax=3,\ a=0,\ b=0,\ c=0; \end{cases}$$

602 — LOOPY:
    LOOPX: — 604
        dl=dl+5; — 606
        ++x, jump (!xmax) LOOPX; — 608
        dh=dh+10, x=0; — 610
    ++y, jump (!ymax) LOOPY; — 612
614 — a++, b++, c++, y=0;
    jump (amax & bmax & cmax) LOOPY; — 616
    quit — 618

|  | Branch 0 | Branch 1 | Branch 2 | Branch 3 |
|---|---|---|---|---|
| Register N_0 | 0x22  702 | 0x3F  704 | 0x3F  704 | 0x3F  704 |
| Register N_1 | 0x25  706 | 0x3F  708 | 0x3F  708 | 0x3F  708 |
| Register N_2 | 0x11  710 | 0x14  712 | 0x17  714 | 0x3F  716 |
| Register N_3 | 0xXX | 0xXX | 0xXX | 0xXX |
| Register N_4 | 0xXX | 0xXX | 0xXX | 0xXX |
| ⋮ | 0xXX | 0xXX | 0xXX | 0xXX |
| Register N_31 | 0xXX | 0xXX | 0xXX | 0xXX |

FIG. 7

METHOD AND APPARATUS FOR NO-LATENCY CONDITIONAL BRANCHING

BACKGROUND

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify a need for repair, a location of the repair, type of repair needed, and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and uses logical methods to isolate portions of the pattern that do not perform as expected. A test pattern that is generated algorithmically using instructions and commands that are repeated in programming loops consume less space in tester memory. Precise signal edge placement and detection is also a consideration in the effectiveness of a non-volatile tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate transmit vectors that are applied (stimulus) to the DUT, and receive vectors that are expected in return (response). The algorithmic logic that generates these vectors can generally do so without troubling itself about how a particular bit in a vector is to get to or from a particular signal pad in the DUT. At this level it is almost as if it were a certainty that adjacent bits in the vector would end up as physically adjacent signals on the DUT. Life should be so kind!

In reality, the correspondence between bits in a vector at the "conceptual level" and the actual signals in the DUT is apt to be rather arbitrary. If nothing were done to prevent it, it might be necessary to cross one or more probe wires as they descend from a periphery to make contact with the DUT. Such crossing is most undesirable, and it is convention to incorporate a mapping mechanism in the path of the transmit vector to rearrange the bit positions in the transmit vector before they are applied to the DUT, so that task of making physical contact is not burdened with crossings. Receive vectors are correspondingly applied to a reverse mapping mechanism before being considered. In this way the algorithmic vector generation and comparison mechanisms can be allowed to ignore this entire issue. As another example of what such mappers and reverse mappers can do, consider the case when a different instance of the same type of DUT is laid out on the same wafer, but with a rotation or some mirrored symmetry, in order to avoid wasting space on the wafer. These practices also have an effect on the correspondence between vector bit position and physical signal location, but which can be concealed by the appropriate mappings and reverse mappings. It will be appreciated that the mappings and reverse mappings needed for these situations are, once identified for a particular DUT, static, and need not change during the course of testing for that particular DUT.

It is desirable for semiconductor testers in general, and specifically memory testers, to be able to branch on various conditions. It is further important that the branching process be executed efficiently and with accurate and predictable timing at the DUT. Known testers perform one of a few number of branching operations and with very little if any branching combinations and programmability. Most often, a fixed number of conditions are made available which may be included or not in a test program. For maximum flexibility, it is desirable to have a large number of possible program states upon which to choose when formulating branching conditions as well as a capacity to combine two or more of the possible program states to generate a branching condition. In order to provide for the additional level of possibilities for conditional branching using the known method of a fixed number of conditions, the logic and memory requirements to support the function would take up too much electronics real estate to be cost effective. Another known method is to use a two-pass look-up table in which a condition can be calculated and stored in a first pass and then referenced and acted upon in a second pass. Disadvantageously, the two-pass operation is software and processing intensive and creates an undesirable branching latency that affects the ability to accurately present signals to the DUT at speed.

Accordingly, there is a need to provide a large number or possible branching conditions within a minimum amount of electronics real estate to support the conditional branching function and without creating branching latencies.

SUMMARY

An apparatus for conditional branching comprises a sequencer executing a plurality of program instructions where one or more of said program instructions is a conditional branch instruction. The conditional branch instruction specifies a conditional branch address and a destination address. The apparatus also comprises a branch unit comprising a programmable flag selection memory and a plurality of first flag selectors. Each first flag selector presents a flag from a plurality of available flags based upon contents in the flag selection memory. The branch unit further comprises a second flag selector that accepts a plurality of the flags from each of the first flag selectors and selects one of the flags to present as a branch flag based upon said conditional branch address. The branch flag indicates to the sequencer whether to branch according to the branch instruction.

A method for compiling source code containing one or more conditional branching instructions comprises the steps of interpreting the source code, the source code comprising a plurality of program instructions. The method then identifies each conditional branching instruction in the source code, and for each conditional branching instruction, determines a set of flags upon which said conditional branching instruction is based. The method then identifies a flag selection register value for each flag in the set of flags and stores each flag selection register value in a respective one of a plurality of flag selection register array elements. The method then assigns a branch condition address for the conditional branching instruction and encodes the branch condition address in a binary representation of the conditional branching instruction. The method then stores the encoded one or more conditional branching instructions and the flag selection register array elements in an object code format.

BRIEF DESCRIPTION OF THE DRAWINGS

FIG. 6 is segment of code used to describe the function of the branching system.

FIG. 7 is a representation of branching register contents used in the example code of FIG. 6.

DETAILED DESCRIPTION

Figure 1:
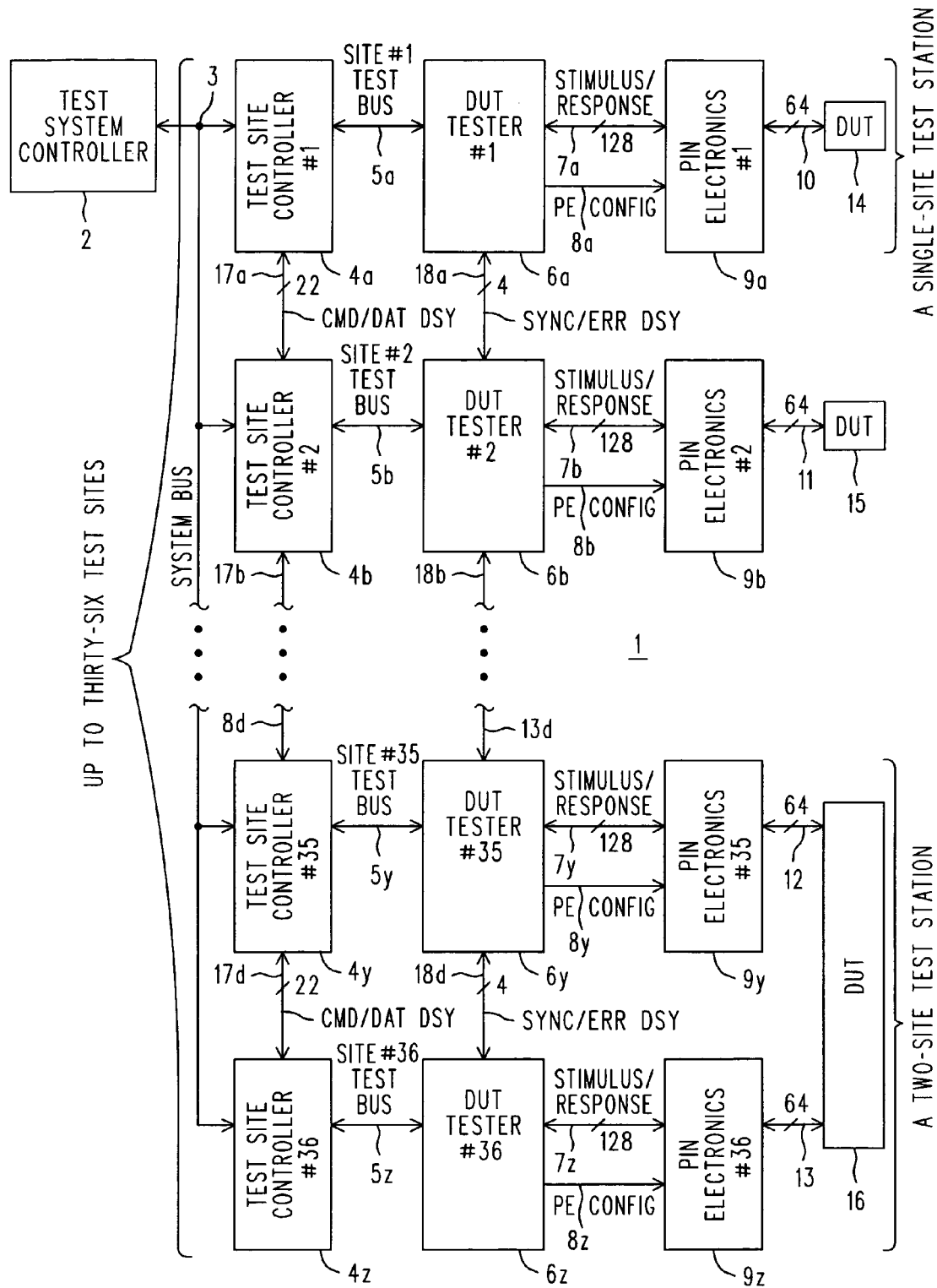
FIG. 1 is amplified block diagram of an extensively configurable non-volatile memory tester constructed according to the teachings of the present invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

To briefly consider the opposite case, one should not assume that an entire Test Site is needed to test a single DUT, or that a single Test Site can test but a single DUT. Suppose that a wafer had two (probably, but not necessarily, adjacent) dies, the sum of whose test channel requirements were sixty-four channels or less. Both DUT's can be tested by a single Test Site. What makes this possible is the general purpose programmability of each Test Site. A test program executed by the Test Site may be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. The only difference is individually keeping track of whether the two "component DUT's" pass or fail, as opposed to a unified answer for the "third" DUT (that is, there is an issue concerning what portion of the "third" DUT failed). This "Single-Site Multi-Test Station" capability is largely conventional, and we mention it here for the sake of completeness, and to ward off potential confusion and misunderstanding when comparing it to the notion of bonding two or more Test Sites together.

Were it not for this notion of reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were split to create more Test Stations (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for ing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (just as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes on the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9*a*. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8*a*.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some these properties are contingent, knowledge of them will nevertheless assist in an appreciation of various examples used to illustrate the invention.

To begin, then, consider four rather large card cages. Each card cage has, besides power supplies and water cooling (fans can be a source of contamination in a clean room environment), a motherboard, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kinds of arrangements can exist for traffic in the other direction, too. Daisy chains are often used to create priority schemes; we shall use them to create master/slave relationships between various Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since here are already nine Test Sites in a card cage, extending the DSY's adds significant cost for relatively little additional benefit.

To resume our discussion of FIG. 1, then, consider the various Test Site Controllers 4*a*–4*z* that can populate the four card cages, each with nine Test Site Controllers. Let's denote them as 4*a*–4*f*, 4*g*–4*m*, 4*n*–4*t* and 4*u*–4*z*. (Never minding, as explained earlier, that these are nominally only twenty-six subscripts—the reader is invited to imagine that there are another ten subscript symbols in there, someplace.) A CMD/DAT DSY 17*a* (Command & Data Daisy Chain) interconnects the Test Site Controller 4*a*–4*f* that are in one card cage, while a different CMD/DAT DSY 17*b* interconnects the Test Site Controllers 4*g*–4*m* in another card cage. The same arrangement exists for the remaining card cages, and Test Site Controllers 4*n*–4*t* and 4*u*–4*z*, respectively. We have earlier said that the DSY do not leave the card cages, in that "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17*a*–*d* that we have been discussing exist between the various Test Site Controllers 4*a*–4*z*. There is a similar arrangement for the SYNC/ERR DSY 18*a*–18*d* and the DUT Testers 6*a*–6*z*. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

Figure 2:
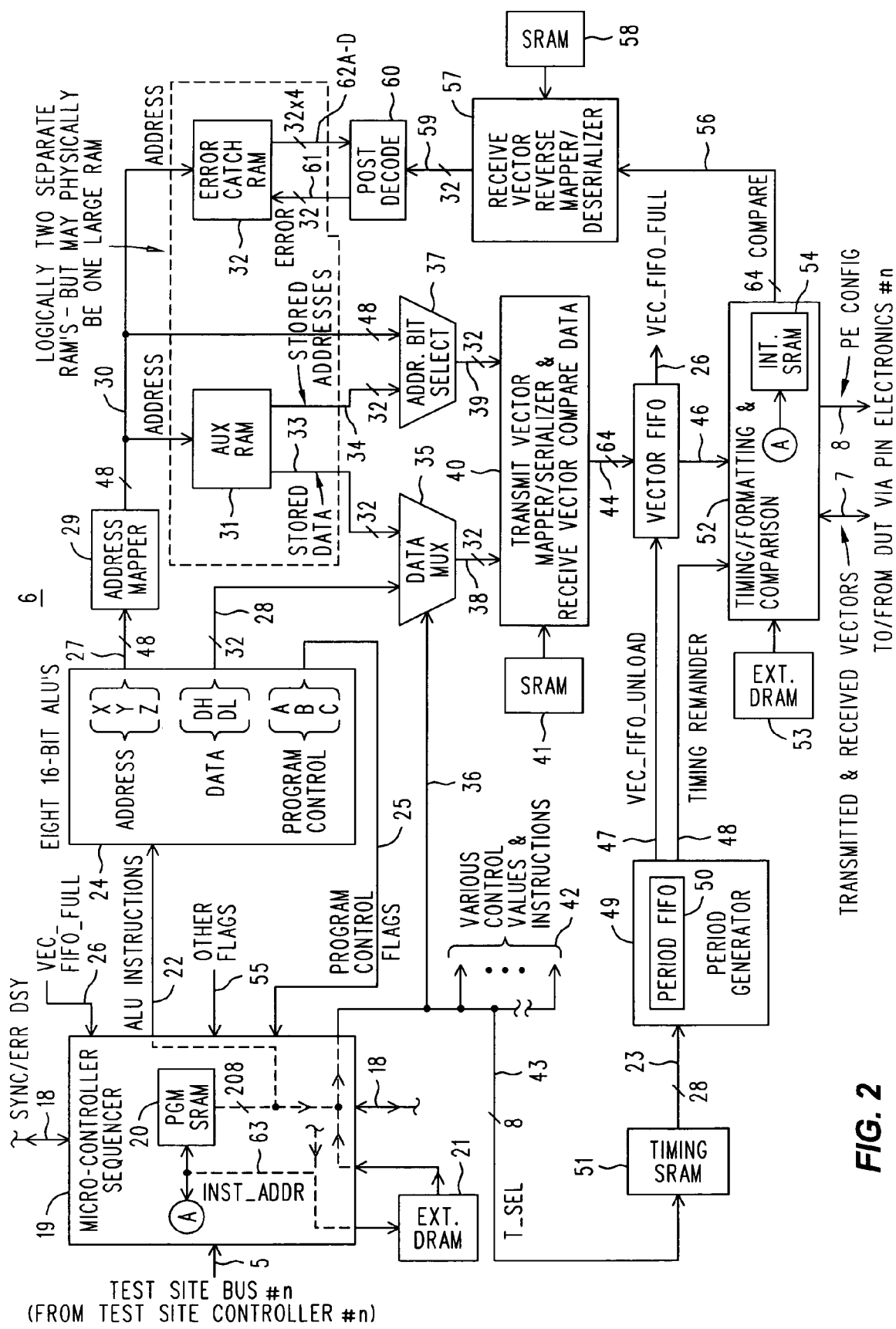
FIG. 2 is a simplified block diagram expansion of the DUT tester 6 of FIG. 1.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff, especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Micro-Controller Sequencer 19, which may be likened to a special purpose microprocessor. It fetches instructions from a program stored in a program memory, which may be either internal to the Micro-Controller Sequencer 6 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is a large IC), so its size is limited. The external DRAM can be provided in adjustable amounts of considerable quantity, but is fast only when accessed in sequential chunks involving linear execution and no branching. Programming in the SRAM 20 most often that which is intensely algorithmic, while the EXT. DRAM 21 is best suited for material not readily generated by algorithmic processes, such as initialization routines and random or irregular data.

The instruction word executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to be supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address in ways familiar to those who understand about microprocessors. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be the size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen)

to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for bottom) mirror image of another section of circuitry. This has the effect of rearranging what the bits mean, as far as what sequential address values are in physical order within that circuitry. This chip layout property may occur many times, and it may well be the case that how one group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how it is actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to an Aux RAM 31 and to an Error Catch RAM 32, which, while having separate functions, may nevertheless be implemented selectable partitions in one larger overall RAM. The mapped address output 30 is also applied as one input to an Addr. Bit Select circuit 37, which is described below.

Consider the Aux RAM 31. Its function is to retain data patterns 33 and addresses 34 that can be applied to the DUT. These are logically separate outputs from the Aux RAM 31, since they are treated somewhat differently and used in different places. (The AUX RAM 31 is not a dual "port memory", but is preferably of several banks whose outputs are applied to MUX's.) In keeping with this, it may be that Stored Data 33 is kept in one bank or range of addresses of the Aux RAM 31, while Stored Addresses 34 are kept in another. Also, we have not shown an explicit mechanism for writing to the Aux RAM 31. That is accomplished by an addressed bus operation initiated by a Test Site Controller 4 at the behest of the program it is executing. (There is an "under the floorboards," as it were, "utility services" bus called the "Ring Bus" [not shown—as it would clutter the drawing immensely] that goes to just about everything in FIG. 2.)

The Error Catch RAM 32 is addressed by the same address that is applied to the Aux RAM 31, and it either stores or retrieves information about errors, which operations are performed in conjunction with a Post Decode Circuit, to be discussed later. As with the paths 33 and 34 from the Aux RAM 31, paths 61 (into the Error Catch RAM) and 62 (from the Error Catch RAM) are preferably MUX'ed outputs from a multi-bank memory (the Error Catch RAM 32), in accordance with configuration information distributed by the Ring Bus (not shown).

Note that the Data MUX 35 has as inputs the STORED DATA output 33 from the Aux RAM 31 as well as data 28 from the registers DH and DL in the collection 24 of ALU's. The Data MUX 35 selects which of these inputs (28, 32) to present as its output 38, which is then applied as one of two vector components to a Transmit Vector Mapper/Serializer/Receive Vector Compare Data Circuit 40 (the other component is the output 39 of the Addr. Bit Select circuit 37). Data MUX 35 performs this selection in accordance with values 36 stored in PGM SRAM 20.

Circuit 40 can perform three functions: assemble vector components (38, 39) into an ordered logical representation of an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19. The output of Circuit 40 is an up to sixty-four bit vector 44 that is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance of Pin Electronics 9 receives Transmitted & Received Vectors 7 and Pin Electronics configuration information 8 from its associated Timing/Formatting & Comparison circuit 52.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54.) The Internal SRAM 54 (or external DRAM 53) assists in the production of Drive and Comparison cycles. Drive cycles apply a transmit vector to the DUT. Comparison cycles receive a vector presented by the DUT and examine it to determine if it matches previously supplied comparison data. Both Drive and Comparison cycles are adjustable as to their duration, whether and when a load is applied, and when data is latched or strobed. The comparison produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and (previously) stored error information 60 (stored in Error Catch RAM) to produce condensed and more readily interpretable error information which may then by stored back into the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/ Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

For purposes of clarity and to establish consistent nomenclature, a conditional branch instruction comprises a program instruction that includes a condition in the form of a logical operation and a branch instruction. The conditional branch instruction causes the sequencer 19 to branch according to the branch instruction if the programmed condition is satisfied or to fetch a next address in memory if the programmed condition is not satisfied. In the disclosed embodiment, the possible branch instructions include; jump, jump alt, call, return, and quit. The jump and call instructions cause the sequencer to branch to a destination address specified in the conditional branch instruction if the condition is true. The jump alt instruction causes the sequencer to branch to a destination address specified in a register in the DUT tester 14 if the condition is true. The return instruction causes the sequencer to branch to an address that is on top of an instruction address stack in the DUT tester 14 and the quit instruction sets a bit indicating that the pattern is finished and returns control to the test site controller 4 if the condition is true. Conditional branches offer significant programming flexibility and adaptability as part of a programming tool to the extent that the options from which the condition may be formulated are sufficiently broad to offer a programmer useful alternatives. A single test pattern, however, need not use a large number of programmed conditions. A large number of options being available is more important than using many of the different options in a single test pattern. Accordingly, the present invention supports up to 32 different programmed conditions for use in a single pattern, yet a programmer may select from 10.7 Million different possible programmed conditions to use. The number of different programmed conditions that may be used in a single pattern is limited only by memory size to support it as is apparent from a full review of the present disclosure. One of ordinary skill in the art recognizes that disclosed invention may be scaled accordingly.

The programmed condition is a Boolean combination of 1 or more branch flags. An example description of a conditional branching instruction is; jump if (flag1 AND flag2 AND NOT flag 3) is true to LABEL1. In the example, only 3 branch flags are used for illustrative purposes even though the disclosed embodiment supports up to 4 branch flags in a single Boolean expression. As one of ordinary skill appreciates, the invention may also be scaled to support more than four branch flags in a single condition with relative ease.

Figure 3:
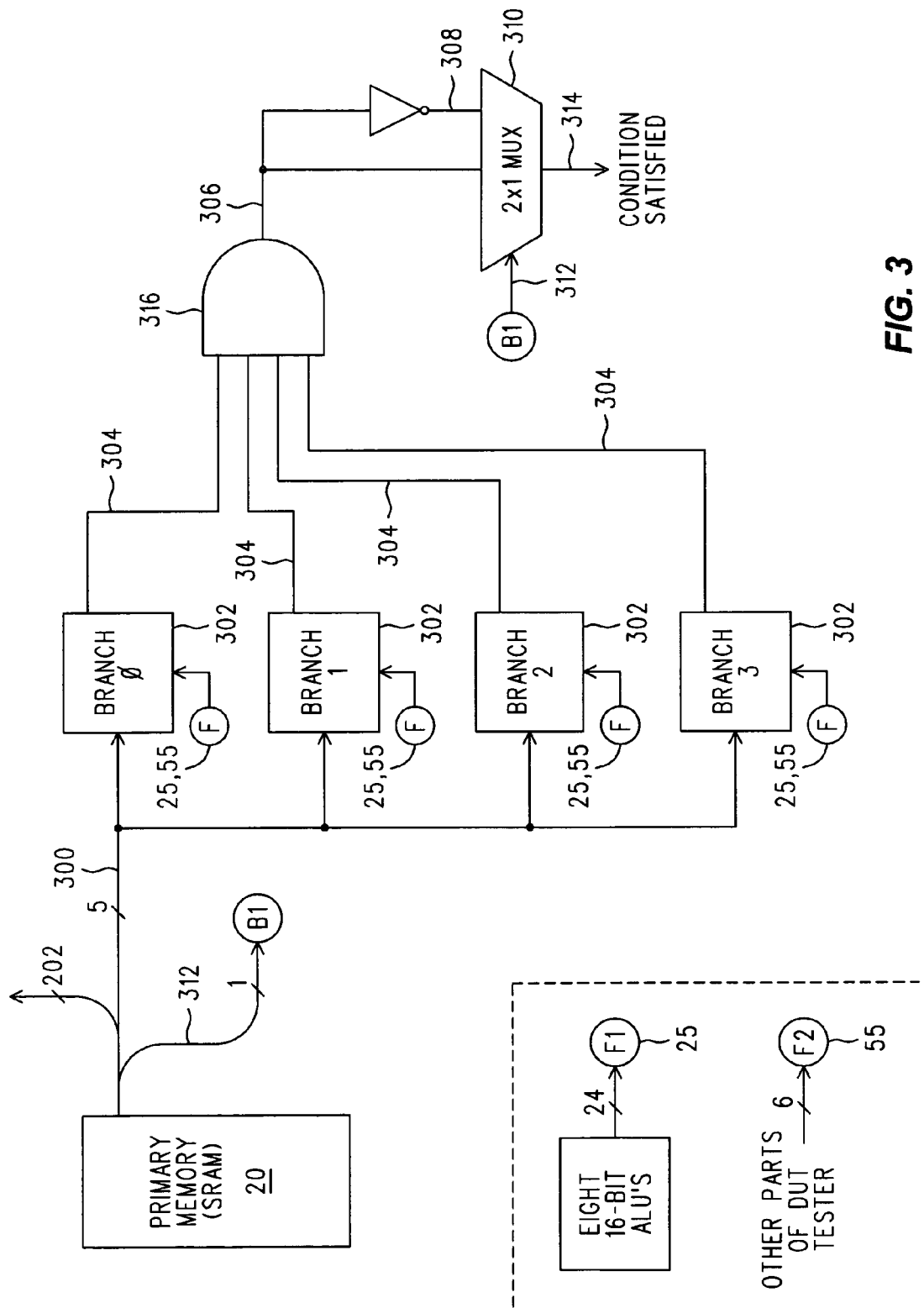
FIG. 3 is a block diagram of a first embodiment of hardware to support conditional branching.

With specific reference to FIG. 3 of the drawings, in a first embodiment of a tester according to the teachings of the present invention, there is shown a portion of the sequencer 19 shown in further detail comprising four branch units 302. For purposes of clarity, the branch units 302 are not shown in FIG. 2 and FIG. 3 does not show additional elements of the sequencer 19 that are unrelated to the present invention. The primary memory or SRAM 20 stores the program instructions that are executed by the sequencer 19 during test operation. Each program instruction comprises a 208-bit binary word, which is provided to the sequencer 19 and other portions of the system in order to carry out the programmed functions. Of the 208 bits for each program word, six(6) of the bits are provided to support the conditional branching function, which is the subject of the present disclosure. Five of the 6 bits comprise a branch condition address 300 and are connected to each of the branch units 302. Each branch unit 302 also accepts thirty-two available flags. The thirty-two(32) available flags comprise the twenty-four program control flags 25 from the ALUs, 6 other flags 55 from various elements of the DUT tester 6, one available flag is unused and is reserved for future use, and one available flag is always a zero indicating no branching. Each branch unit 302 utilizes the thirty-two available flags 25, 55 and the branch condition address 300 to generate a single branch flag [n] 304. The branch flag [n] 304 indicates a true or false status and represents the logical status of each flag used in the programmed condition. All of the branch flags 304 are combined in a logic operator 316 to generate a branching bit 306. The logic operator 316 in the disclosed embodiment is a 4-input AND gate. The branching bit 306 and its inverse 308 are fed into a 2x1 branch value selection multiplexer 310. A b1not0 bit 312 that is the remaining bit of the 6 bits from the program instruction word used to support the conditional branching is used to select either the branching bit 306 or its inverse 308 for a final determination of whether the branching condition is satisfied. If the b1not0 bit 312 is true, it directs the system to branch on a true branching bit 306. If the b1not0 bit 312 is false, it directs the system to branch on a false branching bit 306. The output of the branch value selection multiplexer 310 is a branch condition satisfied bit 314. The branch condition satisfied bit 314 directs the sequencer 19 to fetch the next instruction if it is false and to branch according to the branch instruction if it is true.

Figure 4:
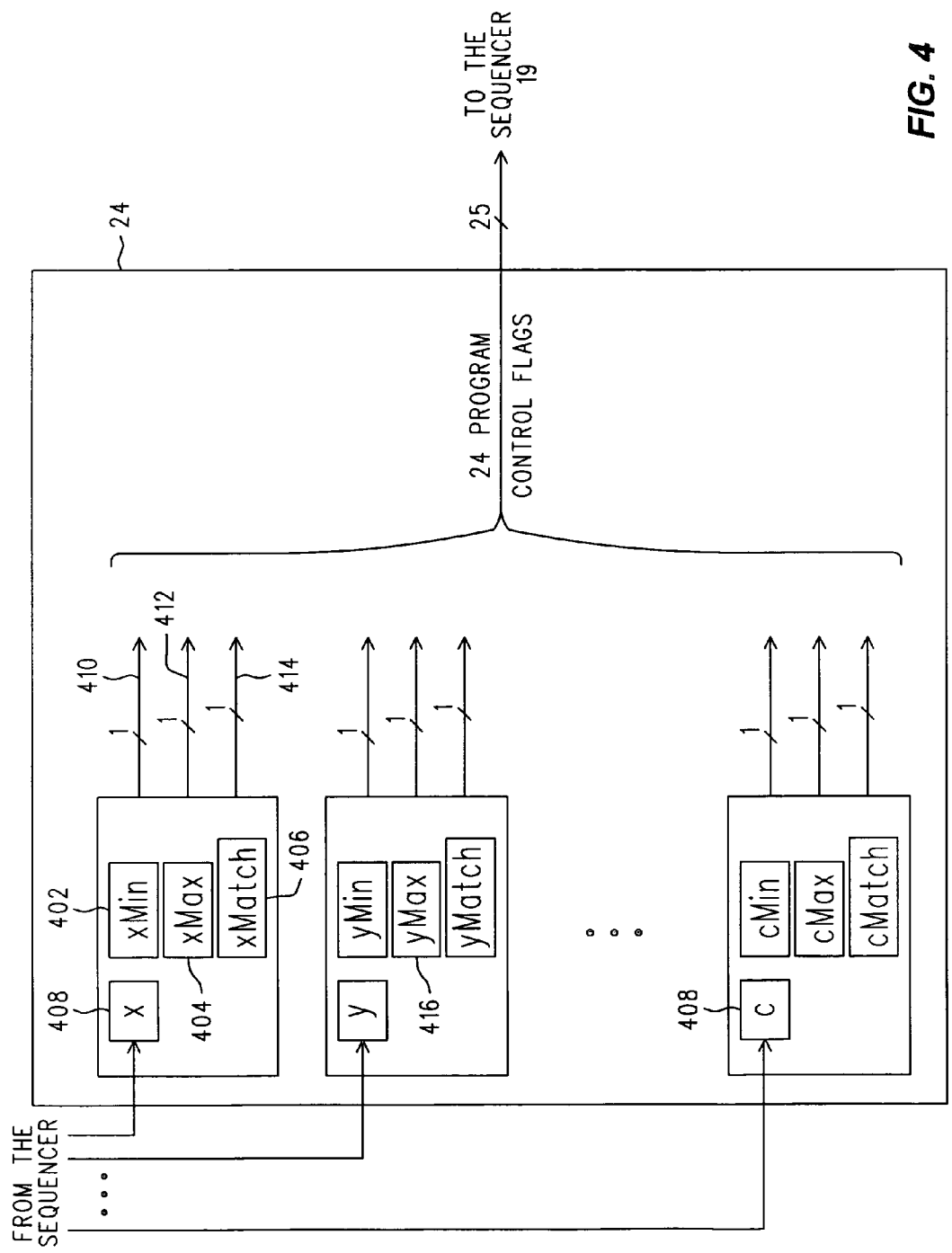
FIG. 4 is a simplified block diagram of an ALU section relevant to the conditional branching function.

With specific reference to FIG. 4 of the drawings, there is shown a simplified block diagram, which is a representative illustration of salient portions of the 16-bit ALUs 24 that relate to the conditional branching function. The twenty-four program control flags 25 may be further described with reference to the eight 16-bit ALUs; x, y, z, dh, dl, a, b, and c 24 shown in FIG. 2 of the drawings. Only ALUs x, y, and c are shown for clarity and to eliminate unnecessary redundancies. The remaining ALUs have identical structure with respect to the present invention. For each of the eight ALUs, there are three ALU registers: Min 402, Max 404, and Match 406. Any or all of the ALU registers may be loaded prior to test pattern execution by the test site controller 4. In addition, the system also has software constructs that direct the sequencer 19 to programmatically load a value into one or more of the Min 402, Max 404, and Match 406 registers at any time during program execution or to execute ALU commands that set the register values. There are three program control flags 25 that correspond to each of the eight ALUs. These program control flags 25 are available to the sequencer 19 and indicate a value in an ALU variable 408 relative to the ALU registers 402, 404, and 406. There is a compare function that is part of each ALU that compares the ALU variable 408 to each one of the Min, Max, and Match registers 402, 404, 406. The comparison is a hardware function that is performed by the ALU during the current program instruction cycle. A Min program control flag 410 is true hen the respective ALU variable 408 value is equal to the value that has been programmed into the Min register 402. Similarly, the Max or Match flags 412, 414 are true when the ALU variable 408 value is equal to one of the values that has been programmed into the Max or Match registers 412, 414, respectively.

Using the x ALU as an example, a user may program the xMin register 402 with a value of 0x00, the xMax register 404 with a value of 0xFF, and the xMatch register 406 with a value of 0x77. In the example, suppose that the user also programs the x ALU variable 408 to begin at 0 and increment by 1. When the x ALU variable 408 is first set, the xMin flag 410 is asserted true and the xMax and xMatch flags 412, 414 are false. As the x ALU variable 408 increments by 1, all of the x ALU program flags 410, 412, 414 are false. When the x ALU variable increments to a 0x77 value, i.e. a value that is equal to the value in the xMatch register 406, the xMatch flag 414 is asserted true and the xMin flag 410 and the xMax flag 412 are false. As the x ALU variable 408 further increments, the xMin, xMax, and xMatch flags 410, 412, 414 are all false until such time as the x ALU variable 408 increments to a point where it is equal to the value in the xMax register 404. At that time, the xMin and xMatch flags 410, 414 are false, and the xMax flag 412 is true.

There are six additional flags 55 that are also available to the portion of the sequencer 19 that supports the conditional branching function. The additional flags 55 are single bit signals that are available to the sequencer 19 from components of the DUT tester 6 that are separate from the ALUs 24. In the disclosed embodiment, the remaining flags comprise a real time counter interrupt, CPU flags 0 & 1, a program functional error flag, a program parametric error flag, and an ECR error flag. All of the program control flags 25 and the other flags 55 are available to the branch units 302 in support of the conditional branching function.

Figure 5:
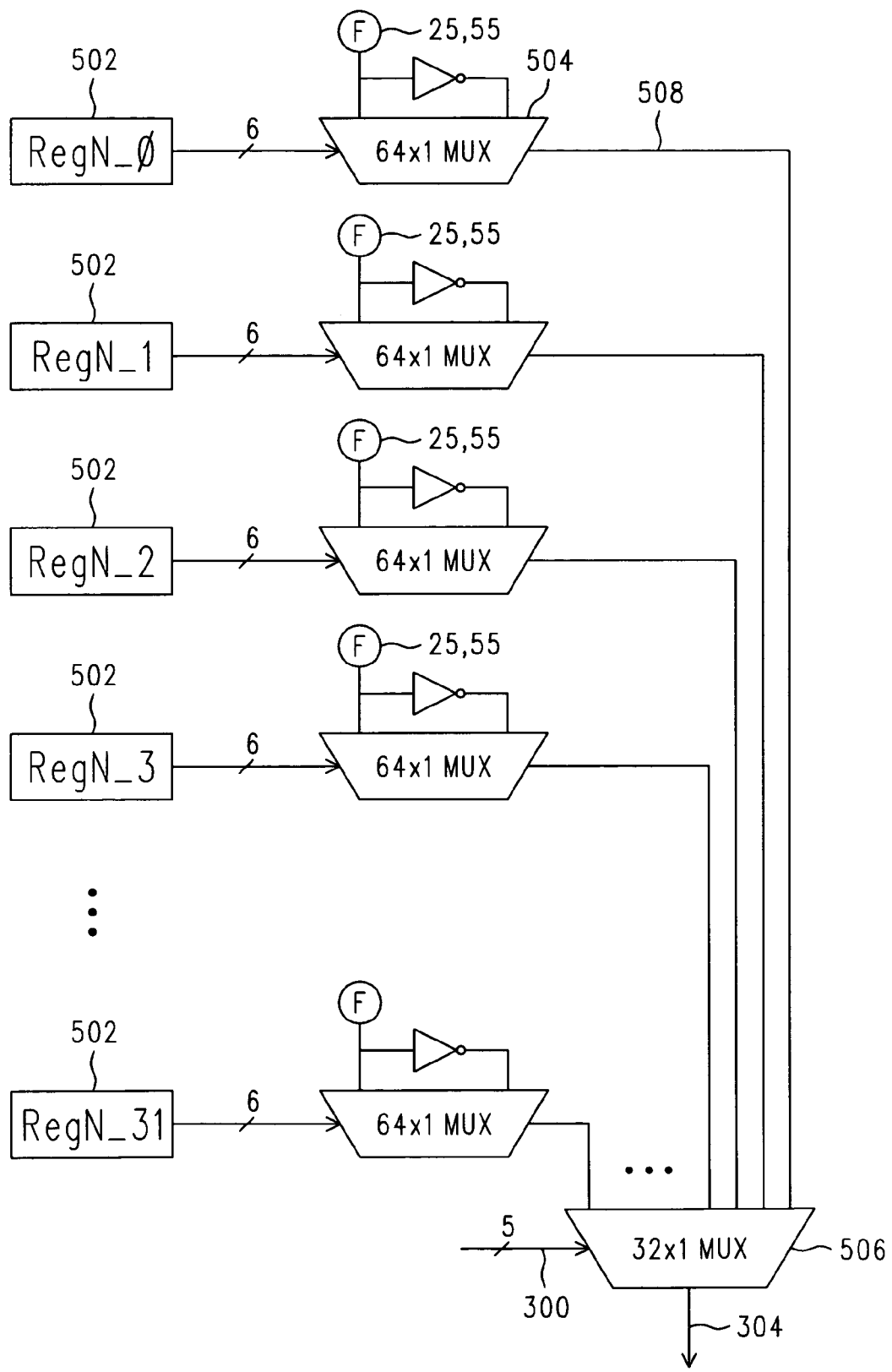
FIG. 5 is a block diagram of the branch units shown in FIG. 3.

With specific reference to FIG. 5 of the drawings, there is shown a more detailed view of the structure for the first embodiment of each branch[n] unit 302. Each branch[n] unit 302 is identical in structure, a generic branch[n] unit being shown for illustrative purposes to avoid redundancies that are unnecessary to complete understanding. Each branch[n] unit 302 has a flag selection memory 502 associated therewith. In the disclosed embodiment, the flag selection memory is a set of thirty-two( 32) 6-bit flag selection registers 502. In the drawings, the flag selection registers 502 follow a labeling convention of Register N_m, where N refers to the respective branch number and m is the N branch's respective flag selection register number. A value loaded into each flag selection register 502 selects one of 64 inputs to a first flag selector 504. In the disclosed embodiment, the first flag selector 504 is a 64x1 flag selection multiplexer. The sixty-four(64) inputs into the flag selection multiplexer comprise the twenty-four(24) program control flags 25 from the ALUs 24, the six(6) other flags 55 from various elements of the DUT tester 6, the unused flag and the "always zero" flag. Each of the thirty-two(32) available flags are inverted and are also input into each flag selection multiplexer 504 for a total of sixty-four(64) available flags. The 6-bit value in each of the flag selection registers 502 selects one of the sixty-four(64) flags. A flag selection output 508 of each flag selection multiplexer 504 is input into a second flag selector 506. In the disclosed embodiment, the second flag selector is a 32x1 branch multiplexer 506. The 5-bit branch condition address 300 selects one of the thirty-two (32) inputs to the branch selection multiplexer 506 to generate the branch flag [n] 304. The contents of all of the flag selection registers 502 are loaded prior to program execution. Processing in the first flag selector 504 occurs in parallel with the presentation of the branch condition address 300 to the second flag selector 506. Accordingly, the flag selection outputs 508 are available to the second flag selector 506 at approximately the same time in the instruction cycle as the branch condition address 300. The determination of the branch state, therefore occurs in a single instruction cycle and does not add latency to the instruction processing time.

With specific reference to FIGS. 6 and 7 of the drawings, there is shown a simplified example of test program code and the values in the flag selection registers 502 that support the code. As one of ordinary skill in the art can glean from a review of FIG. 6, the simplified code is not particularly useful as shown and is for illustrative purposes only. The first four lines 600 of the code initialize the x, y, dl, dh, a, b, and c ALU varibles 408, the xMin and xMax registers 402, 402, the yMin and yMax registers, and the aMax, bMax, and cMax registers. The next two lines of code define a LOOPY entry point 602 and a LOOPX entry point 604. In the next line 606 the dl ALU variable is incremented by 5. The next line 608 increments x by 1 and includes a conditional branch. The "jump(!xMax)" command directs the sequencer to jump to the LOOPX entry point 604 if the x ALU variable 408 is not equal to the value stored in the xMax register 404. Accordingly, there is an incrementing loop that repeats fifty (50) times. If the condition is not satisfied, i.e. the x ALU variable 408 is equal to 50, the sequencer does not branch and advances to the next instruction 610 that increments the dh ALU variable by 10 and resets the x ALU variable 408 to zero(0). The code continues by incrementing the y ALU variable by one(1) and includes another conditional branch at 612, this time comparing the y ALU variable with the value in the yMax register. The instruction directs the sequencer 19 to branch to the LOOPY entry point 602 if the y ALU variable is not equal to the value in the yMax register 416. If it is, the next instruction 614 increments the a, b, and c ALU variables by one(1) and resets the y ALU variable. The third conditional branch 616 is a conjunctive Boolean combination of the flags indicating that the a, b, and c ALU variables are all equal to the values in the a, b, and c Max registers. When they are, the sample code quits at 618.

A compiler that converts the code into binary instruction words generates the values that are to be loaded into the flag selection registers 502. In the first embodiment, each branch unit 302 comprises a unique set of thirty-two(32) flag selection registers 502. Accordingly, in order to support up to four(4) branch flags 304 in each condition, there are a total of one hundred twenty-eight(128) flag selection registers 502. If a single program were to require more than thirty-two(32) branch conditions, the flag selection registers 502 must be reloaded with the appropriate values.

With specific reference to FIG. 7 of the drawings, there is shown the values for each of the one hundred twenty-eight (128) flag selection registers 502. The first condition 608 is based upon the inverse of the xMax flag. No other flags are used in the first condition 608. The value loaded into the Register 0_0702 is a 0x22. The 0x22 value in the example, while apparently arbitrary is assigned to select the inverse of the xMax flag 412 to be presented as an output 508 of the first Branch unit 0 64x1 flag selection multiplexer 504. The Register 1_0, Register 2_0, and Register 3_0 704 that correspond to the Branch unit 1, Branch unit 2, and Branch unit 3 flag selection registers 502 respectively, are loaded with a 0x3F value. The 0x3F value, i.e. all 1's, results in a flag selection output 508 having a value that is always one(1). The compiler stores each flag selection register value as flag selection register array elements. The flag selection register array elements are eventually stored in their binary format as part of the object code created by the compiler. The second condition 612 is based upon the inverse of the yMax register. No other flags are used in the second condition. The value stored and eventually loaded into the Register O_1 706 is a 0x25. The 0x25 value in the example selects the inverse of the yMax flag to be presented as the flag selection output 508 of the second Branch unit 0 64x1 flag selection multiplexer 504. The Register 1_1, Register 2_1, and Register 3_1 708 that correspond to the Branch unit 1, Branch unit 2, and Branch unit 3 flag selection registers 502 respectively, are loaded with a 0x3F value. The third condition 616 is based upon a conjunctive combination of the aMax, bMax, and cMax flags. In this case, three(3) of four(4) possible flags are used to generate the branching bit 306. The values loaded into the Register O_2 710, Register 1_2 712, and Register 2_2 714 are 0x11, 0x14, and 0x17 respectively. Register 3_2 716 is loaded with the 0x3F value, which will always result in a one("1"). The example code uses only the three conditions. The remaining Register N_3 through Register N_31 718 are not used and their contents are, therefore, irrelevant and are not set by the compiler. The specific values that select which flag is to be presented at the flag selection output 508 are unimportant to the invention. Rather, it is important that specific values are assigned to be consistent with the hardware realities and that the compiler has knowledge of the hardware realities prior to converting source code into object code.

As one of ordinary skill in the art will appreciate upon review of the following materials, the branching system disclosed herein is highly modular in nature and may be expanded by including additional branch units 302 or increasing the size or number of flag selection registers 502.

The compiler that supports the conditional branching apparatus interprets the user created code, such as the code shown in FIG. 7 of the drawings, and generates a corresponding object code comprising a plurality of the binary program instruction words that direct the sequencer and other portions of the DUT tester 6 to perform the specified tasks. For purposes of clarity, only those compiler operations that are directly related to the conditional branching function are described herein.

The conditional branching system in the disclosed embodiment supports the combination of up to four(4) flags using either the logical operator AND (represented in the code with a ",", or an "&"), or the logical operator OR (represented in the code with a "I"). In the present embodiment, the test developer may not include both logical operators in a single branching condition. The logical operator NOT (represented in the code with an "!") may be used with either logical operator and with any of the four flags. Given the amount of logic to interpret in a single instruction, a software-based implementation of conditional branching introduces the possibility of execution latencies that adversely affect the accurate and predictable timing of signals presented to the DUT 14. Accordingly, the conditional branching is performed in hardware based upon values loaded into programmable registers and the branch condition address 300 whose values are determined at the time of program compilation.

For each branching condition, the compiler determines if the logical operation contained within the branching condition instruction is conjunctive (uses the AND logical operator) or disjunctive (uses the OR logical operator). If the logical operation is disjunctive, the compiler converts it into the conjunctive equivalent by inverting the entire operation and resetting a b1not0 bit 312. Due to the fact that the hardware provides a conjunctive operator 316 for each of the branch flags 304, the conversion to the conjunctive equivalent of the conditional branch simplifies the compiler code. During program execution, if the b1not0 bit 312 is reset, i.e. has a value of zero(0) the conditional program instruction branches if the result of the logical operation is false. If the logical operation is conjunctive, the compiler does not invert the logical operation and the compiler sets the b1not0 bit 312. During program execution, if the b1not0 bit 312 is set, i.e. has a value of one(1) the conditional program instruction branches if the result of the logical operation is true. The compiler then puts all of the designated flags conditions in a small array. The compiler then orders all of the operations into a fixed format regarding placement of each of the designated flags in the logical operation. This re-ordering to a more rigorous format permits the compiler to recognize redundant uses of the same conditional branch. It provides more efficient use of memory and improves user flexibility by not imposing the more rigorous format during test development. After the designated flags are properly ordered, the compiler generates the values that are to be loaded into the one hundred twenty-eight flag selection registers 502 and associates each set of four(4) flag selection registers 502 with a unique 5-bit branch condition address. The compiler has a priori knowledge of the values necessary to cause the flag selection register 502 to select the designated flag. The compiler contains a look-up table that contains a unique value for each available flag. The compiler identifies the designated flag in the look-up table and then references the unique value to which it is associated. The actual values in the look-up table are dependent upon the physical connection of the flags and their inverses to the flag selection multiplexers 504. Accordingly, the look-up table in the compiler must logically adhere to the physical connections in the hardware.

The compiler assigns the appropriate values in the first set of four(4) flag selection registers 502 according to the programmed condition. The first set of four(4) flag selection registers 502 corresponds to a "0x00" value for the branch condition address 300. The compiler places the "0x00" value for the branch condition address value is placed in the branch condition address field and also places the appropriate value for the b1not0 bit 312 in its appropriate field in the conditional branch program instruction. The compiler then processes each subsequent set of four(4) flag selection registers by assigning appropriate values based upon the programmed condition in the second conditional branch instruction placing the next incremental value in the branch address field until all of the conditional branch instructions have been processed. Both the flag selection register values 502 and the program instruction words are stored as object code. The object code is downloaded to the test site controller 4 prior to execution of a test program. The test site controller 4 accepts the flag selection register values and in a test program initialization step, loads each flag selection register with the appropriate value. During test program execution, all conditional branching operations are effected in hardware to achieve conditional branching without introducing program latencies. Due to the programmability of the flag selection registers 502, the conditional branching is flexible and may be used to select a single conditional branch from a selection of 10.7 Million possible combinations.

Figure 8:
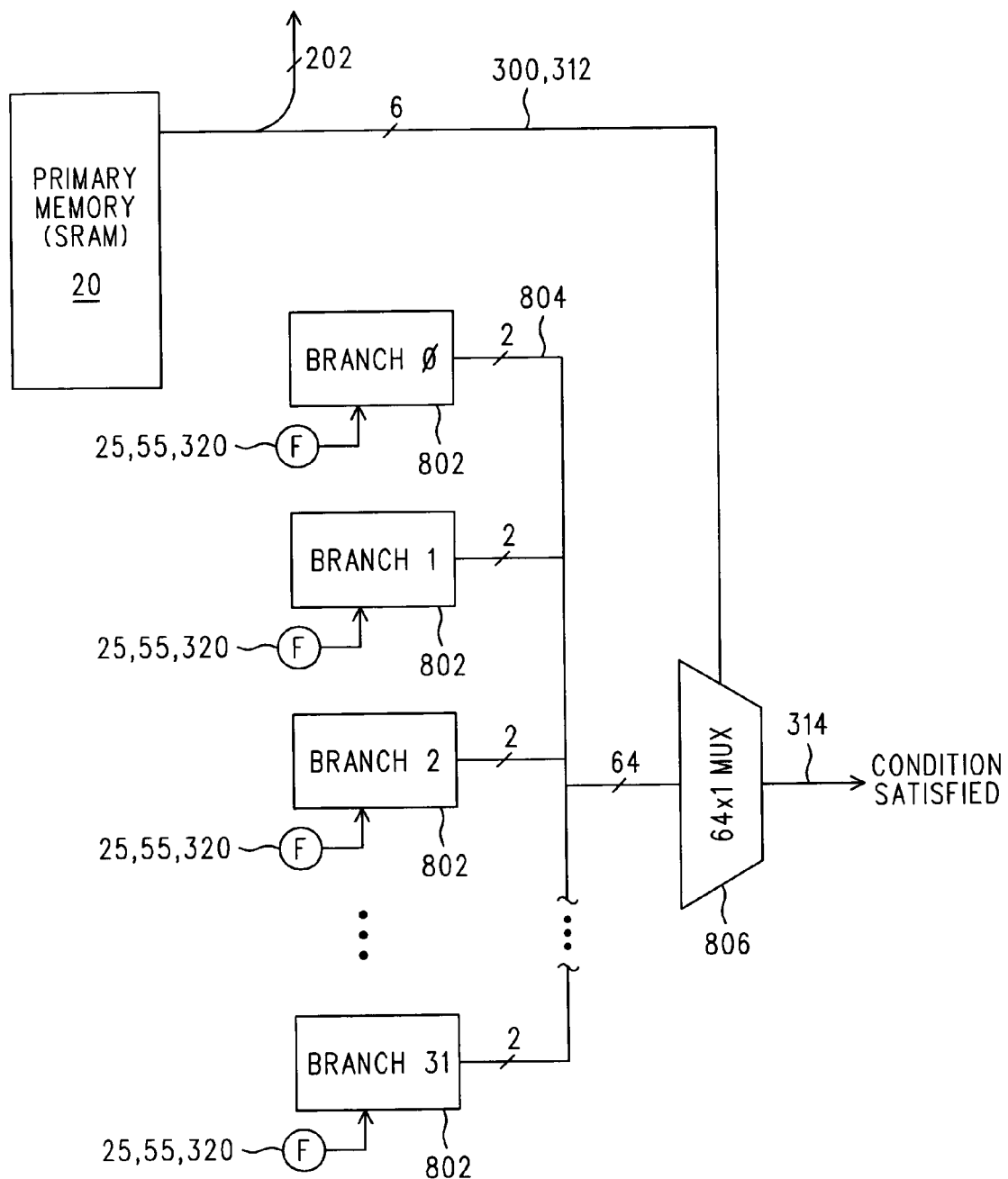
FIG. 8 is a block diagram of a second embodiment of hardware to support conditional branching.
Figure 9:
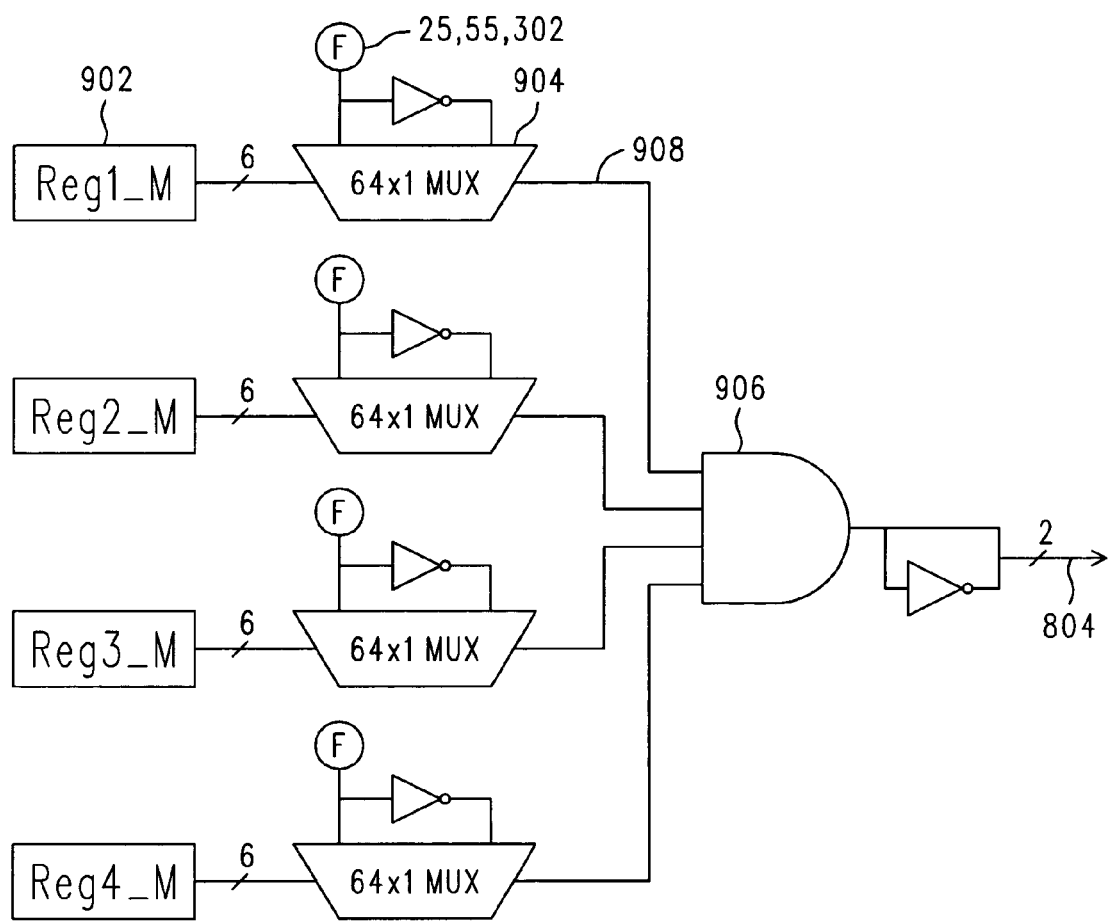
FIG. 9 is a block diagram of the branch units shown in FIG. 8.

In an alternate embodiment of an apparatus to perform conditional branching according to the teachings of the present invention and with specific reference to FIGS. 8 and 9 of the drawings, there is shown thirty-two(32) branch units 802 used to generate the condition satisfied bit 314. Each branch unit 802 accepts the same flags as in the first embodiment, specifically, the program control flags 25 and other flags 55. Each branch unit 802 inverts each of the flags and uses these thirty-two(32) flags and their inverses to generate a branching bit 804 and its inverse. Accordingly, each of the thirty-two branch units 802 generate two bits for a total of sixty-four(64) branching bits 804. All sixty-four (64) of the branching bits 804 are input into a condition selection multiplexer 806. The condition selection multiplexer 806 is a 64×1 multiplexer with a six bit selection control. The selection control comprises the 5-bit branch address 300 and the b1not0 bit 312 specified in the conditional branch instruction object code that comes from the primary memory 20. An output of the condition selection multiplexer 806 is the branch condition satisfied bit 314, which has the identical meaning and function as the branch condition satisfied bit 314 described in the first embodiment.

With specific reference to FIG. 9 of the drawings, each branch unit 802 in the second embodiment comprises four flag selection registers 902 and four flag selection multiplexers 904. Each six(6) bit flag selection register selects one of the sixty-four(64) available flags 25, 55 or their inverses as the output of the flag selection multiplexer. The output from each multiplexer represents one of the four possible flags 908 contained in the logical operation that is the condition. All four(4) flags 908 are conjunctively combined in a 4-input AND gate 906. The output of the AND gate 906 is the branching bit 804. The branch unit 802 also provides an inverse of the branching bit 804 as its output. Each branch unit 802, therefore, generates two related branching bits as its output. The b1not0 bit 312 is part of the selection control for the condition selection multiplexer 806 and comprises the bit of information that selects between the absolute or inverse value of the branching bit 804.

The flag selection registers 902 are the same registers as described in the first embodiment. The compiler is not altered and fully supports either embodiment. The distinction between the two disclosed embodiments is that each branch unit 802 in the second embodiment contains one of the flag selection registers from each of the four branch units 302 as disclosed in the first embodiment. The reference to the variable "M" in naming the flag selection registers refers to the branch unit number. Accordingly, for branch unit #22, the flag selection registers 902 include Reg1_22, Reg2_22, Reg3_22, and Reg4_22. The organization in the first embodiment dedicates one of the branch units 302 for each of the four possible flag selections whereas the organization in the second embodiment dedicates one of the branch units 802 for each of the thirty-two(32) possible conditions. As one of ordinary skill in the art appreciates, in the first embodiment, Reg1_22 is the 23rd register contained in the $1^{st}$ branch unit 302 and in the second embodiment, Reg1_22 is the $1^{st}$ register contained in the $23^{rd}$ branch unit 802. The resulting condition satisfied bit 314 is the same, but the logic organization is altered without departing from the claimed scope of this feature.

Although preferred embodiments of the invention are described, they are illustrative only. Other embodiments and modifications of the invention are possible and are covered by the spirit and scope of the appended claims.

What is claimed is:

1. An apparatus for conditional branching comprising:
   a sequencer executing a plurality of program instructions, one or more of said program instructions including a conditional branch instruction, said conditional branch instruction specifying a branch condition address and a conditional instruction,
   a branch unit comprising a flag selection memory capable of being programmed with a plurality of selection values, each selection value providing independent selection input into a respective plurality of first flag selectors, each respective first flag selector presenting at an output a respective first stage selected flag from a plurality of available flags based upon each said selection value, a second flag selector accepting a plurality of said first stage selected flags and selecting one of said first stage selected flags to present as a branch flag based upon said branch condition address, said branch flag indicating to said sequencer whether to branch according to said conditional instruction.

2. An apparatus as recited in claim 1 and further comprising a plurality of said branch units and further comprising an operator that accepts a respective plurality of said branch flags and logically combines said branch flags to create a branching bit, said branching bit indicating whether said sequencer is to branch according to said conditional instruction.

3. An apparatus as recited in claim 1, said flag selection memory comprising a plurality of programmable registers.

4. An apparatus as recited in claim 1, each said first flag selectors comprising a multiple input, single output multiplexer.

5. An apparatus as recited in claim 1, said second flag selector comprising a multiple input single out multiplexer.

6. An apparatus as recited in claim 2, said operator comprising a multiple input logical AND operator.

7. An apparatus as recited in claim 1, wherein said branch address comprises a plurality of bits in said conditional branch instruction.

8. An apparatus as recited in claim 1 and further comprising a b1not0 bit in said conditional branch instruction directing said sequencer whether it is to branch on a one or a zero of said branch flag.

9. An apparatus as recited in claim 2 and further comprising a b1not0 bit in said conditional branch instruction directing said sequencer whether it is to branch on a one or a zero of said branch flag.

10. An apparatus as recited in claim 9 and further comprising a dual input selector accepting said branching bit and an inverse of said branching bit, said b1not0 bit operating on said dual input selector.

11. An apparatus as recited in claim 10, wherein said dual input selector is a dual input single output multiplexer.

12. A method for compiling source code containing one or more conditional branching instructions comprising the steps of:
   interpreting the source code, the source code comprising a plurality of program instructions, identifying each conditional branch instruction in said source code, and for each conditional branch instruction, determining a set of flags as a subset of all available flags upon which each said conditional branch instruction is based, identifying a flag selection value for each flag in said set of flags, and storing each said flag selection register value in a respective one of two or more flag selection register array elements, assigning a branch condition address for said conditional branching instruction, encoding said branch condition address in a binary representation of said conditional branching instruction, and storing said encoded one or more conditional branching instructions and said flag selection register array elements in an object code format.

13. A method for compiling source code as recited in claim 12, the step of identifying each conditional branching instruction further comprising the step of re-ordering said set of flags to a set placement format.

14. A method for compiling source code as recited in claim 12 and further comprising the step of converting all disjunctive operations to a conjunctive equivalent.

15. An apparatus for conditional branching comprising:
   a compiler for converting source code including one or more conditional branch instructions into object code, the compiler assigning values for a branch condition address and values for a flag selection memory,
   a sequencer executing said object code comprising one or more of said conditional branch instructions, each said conditional branch instruction specifying a branch condition address and a conditional instruction, and
   a branch unit comprising said flag selection memory capable of being programmed with a plurality of selection values, each selection value providing independent selection input into a respective plurality of first flag selectors, each respective first flag selector presenting at an output a respective first stage selected flag from a plurality of available flags based upon each said selection value, a second flag selector accepting a plurality of said first stage selected flags and selecting one of said first stage selected flags to present as a branch flag based upon said branch condition address, said branch flag indicating to said sequencer whether to branch according to said conditional instruction.

16. An apparatus for conditional branching as recited in claim 15, said compiler also converting disjunctive logical operations specified in each said conditional branch instructions to an equivalent conjunctive logical operation.

17. An apparatus for conditional branching as recited in claim 16, said compiler setting a b1not0 bit for said program instruction if said logical operation is converted from said disjunctive logical operation to said equivalent conjunctive logical operation.

18. An apparatus for conditional branching as recited in claim 15, and further comprising one or more arithmetic logic units that supply said plurality of available flags.

* * * * *